US011561094B2

United States Patent
Ward et al.

(10) Patent No.: US 11,561,094 B2
(45) Date of Patent: Jan. 24, 2023

(54) METHOD AND SYSTEM FOR CONTROL AND READOUT OF TUNING FORK GYROSCOPE

(71) Applicant: The Charles Stark Draper Laboratory, Inc., Cambridge, MA (US)

(72) Inventors: Paul A. Ward, Dedham, MA (US); Richard D. Elliott, III, North Reading, MA (US); Daniel Joseph Guyon, Cambridge, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 272 days.

(21) Appl. No.: 16/654,626

(22) Filed: Oct. 16, 2019

(65) Prior Publication Data

US 2020/0116487 A1  Apr. 16, 2020

Related U.S. Application Data

(60) Provisional application No. 62/746,107, filed on Oct. 16, 2018.

(51) Int. Cl.
*G01C 19/5607* (2012.01)
*H03F 1/08* (2006.01)

(52) U.S. Cl.
CPC ............ *G01C 19/5607* (2013.01); *H03F 1/08* (2013.01)

(58) Field of Classification Search
CPC ............ G01C 19/5607; G01C 19/5614; G01C 19/5621; G01C 19/5726; G01C 19/574; H03F 1/08; H03F 3/70; H03F 2203/45514; H03F 2203/45618; H03F 3/45475

See application file for complete search history.

(56) References Cited

U.S. PATENT DOCUMENTS

| | | | |
|---|---|---|---|
| 5,349,855 A | 9/1994 | Bernstein et al. |
| 5,481,914 A | 1/1996 | Ward |
| 5,600,064 A | 2/1997 | Ward |
| 5,604,309 A | 2/1997 | Ward |
| 5,608,351 A | 3/1997 | Ward |

(Continued)

FOREIGN PATENT DOCUMENTS

| ES | 2 229 934 A1 | 4/2005 |
|---|---|---|
| JP | 2006329665 A | 12/2006 |

OTHER PUBLICATIONS

Ward, P., et al., "Oscillator Phase Noise: Systematic Construction of an Analytical Model Encompassing Non-Linearity," IEEE Transactions on Ultrasonics, Ferroelectrics, and Frequency Control, 58(1): 195-205 (2011).

(Continued)

*Primary Examiner* — Xin Y Zhong
(74) *Attorney, Agent, or Firm* — HoustonHogle LLP

(57) ABSTRACT

A tuning fork sensor system places a controlled bias on the proof-mass drive-axis electrodes to cancel the quadrature charge. Also, its charge amplifiers employ a field-effect transistor biased slightly into the triode region so that it behaves as a very large value resistor. In addition, it uses a phase-locked loop having a special loop filter in order to optimize performance by rejecting off-frequency drive feedthrough to the motor pick-off while resulting in very low phase wander for the demodulation references.

12 Claims, 6 Drawing Sheets

(56) References Cited

U.S. PATENT DOCUMENTS

| | | |
|---|---|---|
| 5,672,949 A | 9/1997 | Ward |
| 5,911,156 A | 6/1999 | Ward et al. |
| 6,862,934 B2 | 3/2005 | Weinberg et al. |
| 6,873,206 B1 | 3/2005 | Hildebrant et al. |
| 2002/0075056 A1* | 6/2002 | Sauer .................. G06G 7/186 327/345 |
| 2003/0066351 A1 | 4/2003 | Weinberg et al. |
| 2006/0087370 A1* | 4/2006 | Tsuruhara ............ H03F 3/45475 330/86 |
| 2006/0273805 A1* | 12/2006 | Peng .................. G01R 27/2605 324/686 |
| 2006/0283246 A1 | 12/2006 | Weinberg et al. |
| 2013/0104653 A1* | 5/2013 | Bernstein ............ G01C 19/5691 427/125 |
| 2014/0300425 A1* | 10/2014 | Cazzaniga ......... G01C 19/5776 331/154 |

OTHER PUBLICATIONS

Partial European Search Report, dated Aug. 14, 2020, from European Patent Application No. 19203706.7, filed on Oct. 16, 2019. 15 pages.

Anonymous, "Vibrating structure gyroscope," Wikipedia, Sep. 7, 2018 (Sep. 7, 2018), XP002799567, Retrieved from the Internet: URL:https:jjen.wikipedia.orgjwjindex.php?title=Vibrating structure gyroscope&oldid=858459209—[retrieved on Jun. 29, 2020].

Anonymous "Operational transconductance amplifier," Wikipedia Aug. 2, 2018 (Aug. 2, 2018), XP002799568, Retrieved from the Internet: URL:https:jjen.wikipedia.orgjwjindex.php?title= Operational transconductance amplifier&oldid=853143020— [retrieved on Jun. 30, 2020].

Geen, J.A., et al., "Single-Chip Surface Micromachined Integrated Gyroscope with 50 Degree/h Allan Deviation," IEEE Journal of Solid-State Circuits, 37(12): 1860-1866 (2002).

* cited by examiner

METHOD AND SYSTEM FOR CONTROL AND READOUT OF TUNING FORK GYROSCOPE

RELATED APPLICATIONS

This application claims the benefit under 35 USC 119(e) of U.S. Provisional Application No. 62/746,107, filed on Oct. 16, 2018, which is incorporated herein by reference in its entirety.

BACKGROUND OF THE INVENTION

Tuning-fork rate sensors and specifically gyroscopes are known. They often have a pair of proof-masses intended to oscillate in anti-parallel fashion along a drive axis. Upon rotation of the sensor along an "inertially-sensitive axis," Coriolis acceleration is experienced by the masses, resulting in a small anti-parallel oscillation along this sense axis, called the sense mode oscillation. The sense-mode oscillation amplitude is proportional to inertial rate along the inertially-sensitive axis. The sense-mode oscillation amplitude can be detected by sensitive electronics to produce an inertial rate sensor.

In this vein, U.S. Pat. No. 5,911,156, to Ward, et al., concerns a MicroElectroMechanical system (MEMS) tuning-fork gyroscope (TFG) system that includes two proof-masses and split center and outer motor electrodes. This configuration allows for rejection of errors from mismatch in relative amplitude or phase. By applying excitations of equal and opposite potentials to each set of independent center and outer motor electrodes, each mass cancels the charge generated by its own motion, thereby reducing the in-phase bias errors and minimizing limitations on dynamic range.

U.S. Pat. No. 6,862,934, to Weinberg, et al., recognized the problem that steady state acceleration or gravitational inputs in a direction perpendicular to the plane of the substrate cause both proof-masses to move away from the substrate resulting in a scale factor error. Moreover, tuning fork gyroscopes exhibit bias errors because the motor comb drives impart forces on the proof-masses along the sensing axis. Lift force is caused by the asymmetry where the bottom of the drive combs faces a ground plane while the top sees free space. Nominally, both the left and right outer motors exert forces in opposite directions so that the tuning fork (antiparallel mode) proof-mass motion is excited. The solution was to add sense plates above as well as below the proof-masses thus increasing the scale factor and sensitivity of the gyroscope, and by applying selected voltages to each of the sense plates depending upon the size of the gaps between the sense plates and the proof-masses, thus making tight manufacturing tolerances less critical and decreasing the gyroscope's scale factor sensitivity to acceleration.

SUMMARY OF THE INVENTION

Nevertheless, there are some important errors in tuning-fork gyroscopes that must be suppressed to achieve higher performance. A major error is caused by misalignments of the proof-mass support beams, resulting in sense-axis oscillation that is in phase-quadrature with the Coriolis information. This error term is called "quadrature." Detection of the Coriolis information in the presence of a large quadrature error is a significant challenge in tuning-fork rate sensors.

The present invention can be applied to reduce or eliminate the effects of quadrature motion by injecting a controllable charge that cancels the quadrature charge, resulting in a null of the quadrature signal. The charge is produced by placing a bias on the proof-mass drive-axis comb drives, resulting in an injected charge that is perfectly phased, or more nearly so, to the charge produced by quadrature sense-axis motion, so that the quadrature charge is completely cancelled or at least mitigated. This approach alleviates stringent phase stability requirements that would otherwise need to be imposed on the rate sensor electronics.

The quadrature nulling approach described herein is an improvement to the basic quadrature nulling scheme proposed by Ward in U.S. Pat. No. 5,481,914 entitled Electronics for Coriolis Force and Other Sensors. The present approach builds on previous schemes with the recognition that the bandwidth of the quadrature nulling loop should be equal to or greater than the bandwidth of the inertial rate measurement to avoid negatively impacting the transient response of the sensor. The reason why the transient response of the sensor can be negatively impacted by a slow quadrature nulling loop is because in the presence of a demodulation phase error, the quadrature and rate channels become strongly coupled in the electronics, causing the quadrature loop to respond to a change in rate, and allowing the sluggish response of the quadrature to couple in-turn to the rate channel. The result is unwanted low-frequency dynamic responses in the rate channel.

In more detail, if it is assumed that the quadrature loop response is first-order, and the demodulation phase error is small, it can be shown that the response of the sensor to a step of inertial rate is given by:

$$\text{Gyro Output} \approx \Omega[1+\Theta^2 e^{-t/\tau}]\mu(t)$$

where the ideal response is:

$$\text{Gyro Output Ideal} = \Omega\mu(t)$$

where $\mu(t)$ is a unit step function.

The parameter $\Theta$ is the demodulation phase error, and is ideally zero but generally non-zero. The parameter $\tau$ is the time-constant of the quadrature loop, and is the inverse of the quadrature loop bandwidth if expressed in units of radians per second. Thus, for a non-zero demodulation phase error, there is an undesirable transient term added to the sensor output for the case of a step input in inertial rate. If the quadrature loop is faster than the native response of the rate channel (as set by the rate channel filter), the transient term will have minimal impact on the sensor response. However, it is clear that if the quadrature loop is much slower than the response of the rate channel, there will be a long (and undesirable) tail added to the sensor step response.

Other solutions have been employed in the past to address the quadrature problem. For example, some have used amplifiers having very stable phase to process the rate signal, in which case the effects of quadrature are reduced. However, this is very costly in terms of power dissipation. Still others have used mechanical rebalancing in an attempt to control quadrature, but this results in a much more complicated servo control problem. In contrast, the approach proposed here suppresses errors as a fundamental feature of the architecture, and the enhancement afforded by increasing the quadrature loop bandwidth to be equal to or greater than the rate channel bandwidth results in a nulling of the quadrature signal without any deleterious impact on sensor transient response.

Concerning another innovation, the use of a phase-locked loop in the tuning-fork gyroscope is known. In an architecture using off-frequency drive (see U.S. Pat. No. 5,481,914), the off-frequency drive artifacts couple to the motor pickoff and the rate channel through stray capacitances. Since the motor pickoff signal is used as the phase reference for demodulation, in order to reject off-frequency artifacts in the rate signal, the off-frequency artifacts in the motor pickoff signal must be substantially eliminated. A phase-locked loop (PLL) is used for this purpose.

In order to substantially-eliminate the off-frequency artifacts, the PLL response must be very slow. However, a slow PLL will not reject low-frequency phase wander associated with the voltage-controlled oscillator (VCO).

Therefore, the present invention also relates to simultaneously achieving a very low PLL bandwidth while still adequately reducing the effects of low-frequency VCO phase wander. Accordingly, a PLL loop filter is employed that has a very high gain at low frequency and very low gain at a frequency equal to the frequency of the off-frequency drive artifacts.

Turning now to a third innovation, the tuning-fork gyroscope requires two charge amplifiers—one to amplify/buffer the motor pick-off signal and another to amplify/buffer the rate signal directly at the MEMS sensor.

Each of the charge amplifiers generally used in tuning-fork gyros includes an operational amplifier (op-amp) with a feedback capacitor connected between the op-amp output and inverting input. Any charge transferred to (or from) the inverting input of the op-amp (charge amplifier input) is transferred to the feedback capacitor, and is reflected as a voltage change at the op-amp output.

However, the op-amp will always have a leakage current, and over long periods of time, the charge amplifier feedback capacitor will continue to charge until the amplifier saturates, rendering the charge amplifier useless. To avoid this problem, it is known to place a large resistor across the charge amplifier feedback capacitor in order to bleed-off the charge before it can cause a problem.

The problem associated with the use of a large resistor is that the resistor value needs to be very large, on the order of hundreds of MegaOhms to GigaOhms. Such a large resistor cannot be implemented on an integrated circuit chip in an area-efficient manner.

Therefore, the present invention further relates to replacing the bleed-off resistor. Instead, the present system creates a resistive device or bleedoff circuit by biasing a pair of p-channel field-effect transistors in series. The transistors are biased in subthreshold saturation so that the series pair behaves as a very large value resistor. In order to speed-up the start-up of the charge amplifier when power is first applied, the transistors can be biased into a region where its resistance is much smaller following start-up, and then biased at high resistance thereafter.

The use of the series transistors contrasts with related approaches. For example, U.S. Pat. No. 6,873,206 to Hildebrant, et al. used integrated DC stabilization that was more complex, using an operational transconductance amplifier (OTA) in the op-amp feedback path along with non-linear filter.

In general, according to one aspect, the invention features a charge amplifier for a tuning-fork sensor. It comprises an amplifier, a feedback capacitor connecting an output of the amplifier to an input, and a bleedoff circuit for bleeding charge from the feedback capacitor comprising one or more transistors.

Often, the amplifier is a transconductance amplifier.

Preferably, the bleedoff circuit comprises two transistors connected in series. The gates of the series connected transistors can then be connected to a terminal of a third transistor. A current sink might further be provided between the gates of the series connected transistors and ground. The purpose of the current sink, in one example, is to set a specific bias point to push the PMOS transistors into sub-threshold. It also allows the impedance to be modulated to improve the initial start-up transient. The capacitance of the sensor is present between the feedback capacitor and ground.

Often, the two transistors are biased in subthreshold to implement a large linear resistance, such as wherein gates of the two transistors are connected to each other to ensure that body diodes are not forward biased in the presence of large signals which would degrade linearity. Moreover, a gate bias tracks changes in an input to maintain the same bias point for the two transistors in the presence of large signals.

In a current implementation the gates of the series connected transistors are connected to a terminal of a third transistor, in which the third transistor might generate a gate bias for the two transistors due to a constant current flowing into a current sink. The current sink can be located between the gates of the series connected transistors and ground. As a result, a feedback impedance is changed by changing the current of the current sink to improve start-up.

In general, according to another aspect, the invention features a tuning-fork sensor, e.g., gyroscope, comprising proof-masses, comb drives for driving the proof masses, a motor drive system for driving the comb drives, and a motor bias system for providing a bias voltage on the comb drives for quadrature nulling.

Preferably, the signal containing Coriolis information is digitally filtered to produce the quadrature nulling. In addition, the motor bias system might comprise a digital demodulator for demodulating the digitally-filtered signal containing Coriolis information. In addition, the demodulated signal containing Coriolis information can also be filtered by a comb filter. Then, in operation, a bandwidth of a quadrature nulling loop is equal to or greater than a bandwidth of an inertial rate measurement.

In general, according to another aspect, the invention features a tuning-fork sensor, comprising proof-masses, comb drives for driving the proof masses, a motor drive system for driving the comb drives including a phase locked loop that rejects off-frequency artifacts in a motor pick-off signal.

Preferably, the phase locked loop has high gain at low frequency and low gain at a frequency equal to the frequency of the off-frequency drive artifacts. In addition, a loop filter of the phase locked loop can have a START mode and a RUN mode.

In general, according to another aspect, the invention features a method of operation of a tuning-fork sensor, comprising driving the proof-masses, detecting Coriolis information from the proof-masses; and providing a bias voltage on comb drives of the proof-masses for quadrature nulling.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
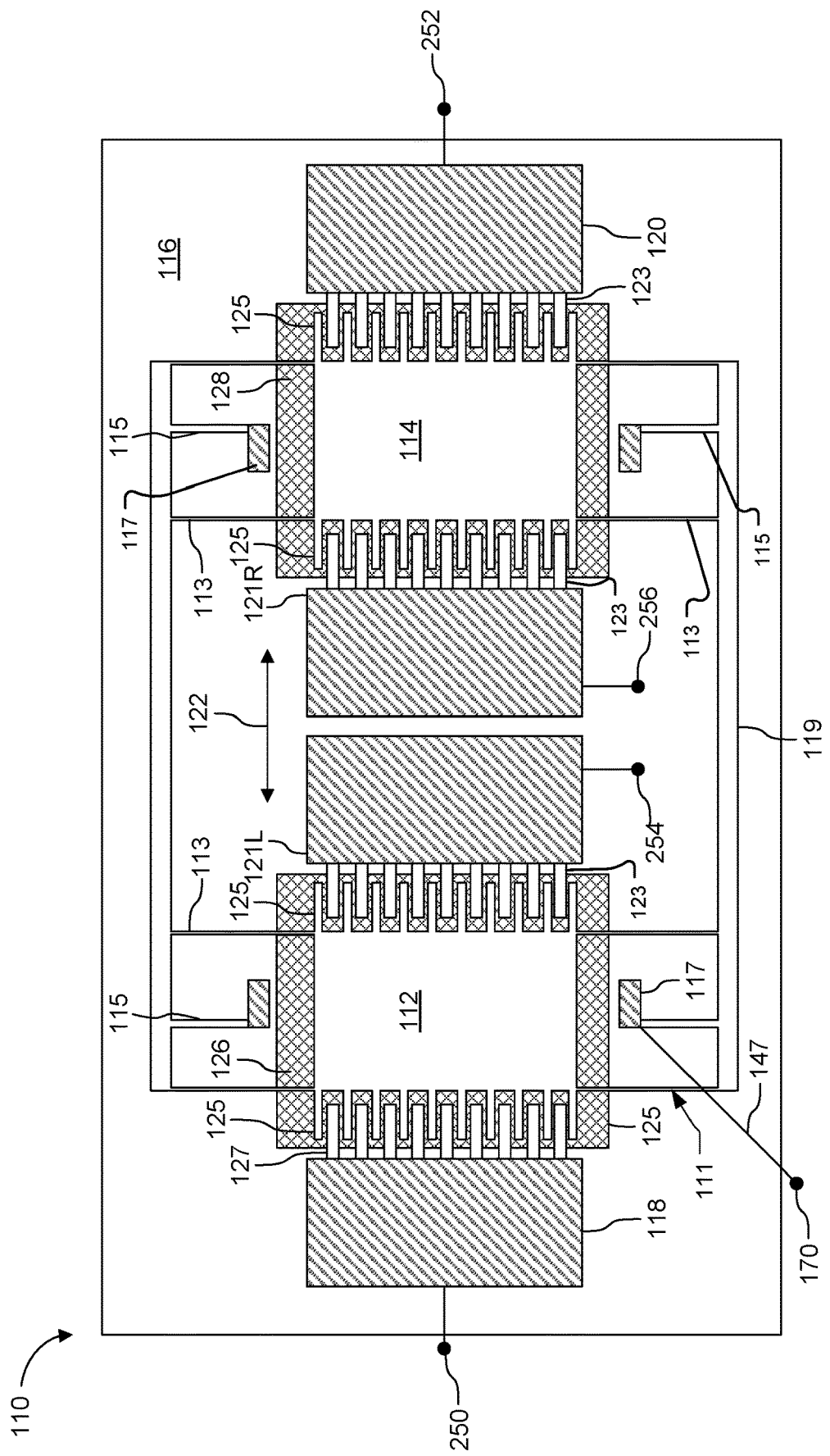
FIG. 1 is a top schematic view of the proof-mass structure and the first or lower substrate of a MEMS tuning fork gyroscope (TFG) to which the invention can be applied.
Figure 2:
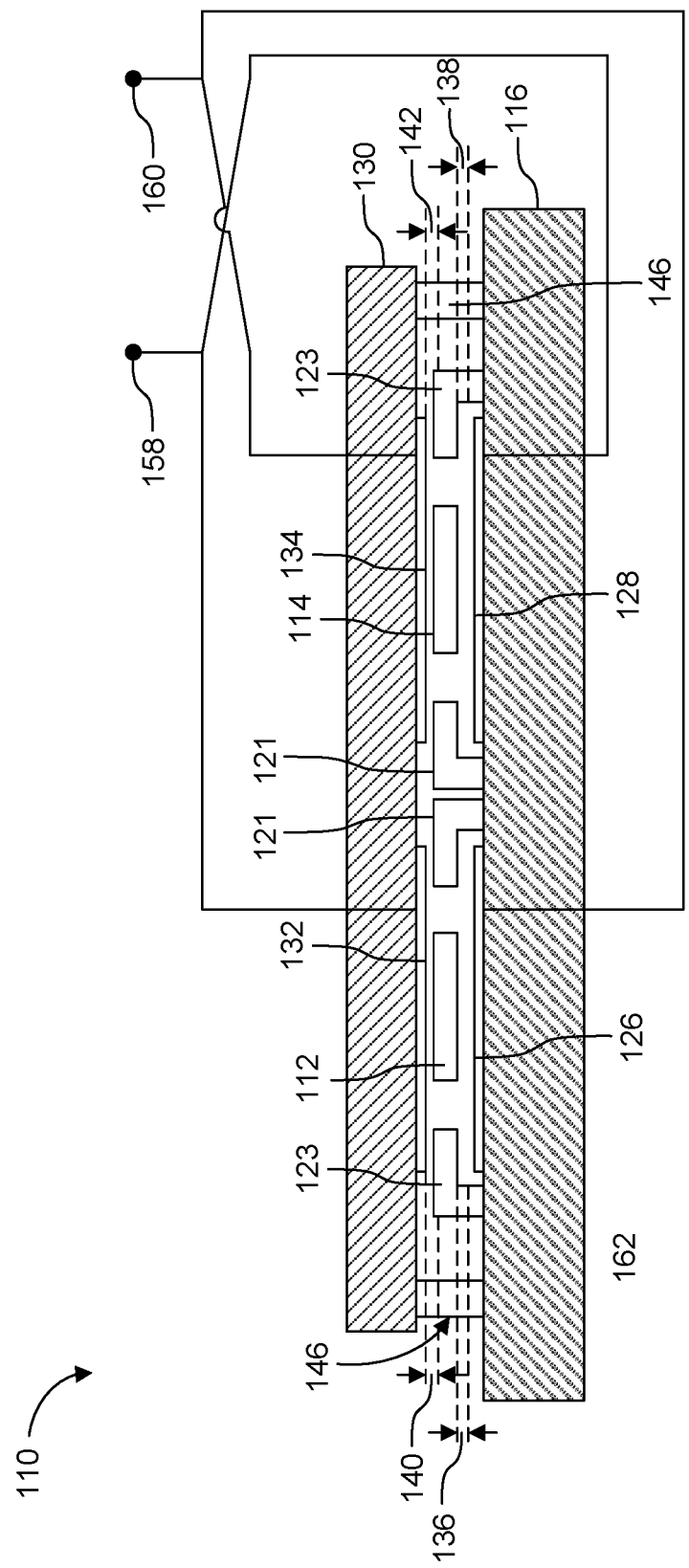
FIG. 2 is a cross-sectional schematic view of the tuning fork gyroscope showing both the upper and lower sense plates.

In FIGS. 1 and 2, proof-masses 112, 114 are suspended above a first or bottom substrate 116 by a support structure 111 that includes drive beams 113, torsion beams 115, anchors 117, and base beams 119.

First and second sense plates 126, 128 are disposed under the proof-masses 112, 114, respectively, and are supported by, such as deposited on, the bottom substrate 116. On the other hand, third and fourth sense plates 132, 134 are disposed over the proof-masses 112, 114, respectively, and are supported by a second or top substrate 130.

Comb drives 118, 120 provide means for oscillating proof-masses 112, 114 along a drive axis, shown by arrow 122. Teeth 127 of the comb drives 118, 120 project toward and between outer teeth 125 of each of the proof-masses 112, 114.

Inner pick-off combs 121 are vertically split into a left pick-off comb 121L and a right pick-off comb 121R. Left inner comb pickoff electrode 254 provides an electrical connection to the left inner pick off comb, and right inner pick off comb electrode 256 provides an electrical connection to the right inner comb drive. The left pick-off comb 121L and the right pick-off comb 121R have teeth 123 that project between inner teeth 125 of each of the proof-masses 112, 114.

Support or conducting silicon posts 146 provide the spacing between substrates 116 and 130 and bring upper sense plate excitation from lower substrate 116.

Sense plates 126, 128, 132, 134 are preferably made of metal, but may also be made of deposited doped silicon. Torsion beams 115 may include folded beams, strain relief chevron beams, or other forms known in the art.

Particularly, first nominal gap 136, FIG. 2, is defined by first sense plate 126 and first proof-mass 112. Similarly, second nominal gap 138 is defined by second sense plate 128 and second proof-mass 114. Third nominal gap 140 is defined by third sense plate 132 and first proof-mass 112, and fourth nominal gap 142 is defined by fourth sense plate 134 and second proof-mass 114.

Each of the sense plates 126, 128, 132 and 134 are interconnected via sense node electrodes 158 and 160. Sense node electrode 158 is electrically connected to sense plates 128, 132; and sense node electrode 160 is electrically connected to sense plates 126, 134.

A rate charge amplifier 201 electrically connects to the first proof-mass 112 and the second proof-mass 114 via electrode 270 from one of the anchors 117 and senses changes in nominal gaps 136, 138, 140 and 142 and provides an output signal indicative of the angular displacement of the gyroscope. The signal from the rate charge amplifier has the form r(t)*sin(w*t), where w is the motor frequency (typically around 20 kHz) and r(t) is the Coriolis information, proportional to inertial rate. The signal r(t)*sin(w*t) is called a "suppressed-carrier AM signal" in the lexicon of communication theory. The term r(t) is the amplitude modulation (AM).

The output from a frequency-separation or rounding circuit F(s) and its inversion drive comb drives 118, 120 via electrodes 250, 252 to oscillate the proof-masses 112, 114. It is used to round the edges of the drive signal in RUN mode, to reduce distortion caused by op-amp slew-rate limiting.

The present solution utilizes DC bias on the sense-node electrodes 158, 160. Sense node electrode 158 receives a DC bias of one polarity, and sense node electrode 160 receives a DC bias of the opposite polarity. This allows application of a very large bias to the sense electrodes, which produces a large rate sensor scale-factor without injecting error signals into the sensor. The large sense-axis bias voltages result in very low rate-equivalent noise (and as a consequence, low angle random walk). However, because DC bias is applied to the sense axis, the signal containing Coriolis information is at the same frequency (for zero-frequency inertial rate) as the force needed to drive the proof-mass drive-axis oscillation. This would lead to large bias errors. To address these errors, this system and method use off-frequency drive to produce a drive force at the drive-axis resonance frequency, while electrical feedthrough artifacts are at a different frequency. In so doing, the drive feedthrough artifacts are easily separated from the Coriolis (rate-related) information using conventional filtering techniques. Further, the off-frequency drive implementation used in this invention is compatible with a simple implementation on a mixed-signal application specific integrated circuit (ASIC). The off-frequency drive method used here provides for a drive signal that is the sum of two half-resonance frequency square-waves. One half-resonance square wave is fixed in amplitude while the second half-resonance square wave has an amplitude that can be automatically adjusted to adjust the drive force amplitude, enabling amplitude control for the in-plane proof-mass oscillation.

The mathematics describing the drive signals is as follows. The adjustable-amplitude component is given by:

$$v_1(t) = Asq\left(\frac{\omega t}{2}\right)$$

Where $v_1$ is the drive signal applied to electrode 250 for the first proof-mass 112, A is the amplitude of the first component of the drive signal (which is adjustable), and $\omega$ is proof-mass oscillation frequency.

The fixed-amplitude component is given by:

$$v_2(t) = Bsq\left(\frac{\omega t}{2} - 90\right)$$

Where $v_2$ is the drive signal applied to electrode 252 for the second mass 114, B is the amplitude of the second component of the drive signal.

Both of these signals ideally have zero energy at frequency $\omega$, which is the proof-mass oscillation frequency. However, since the drive force is proportional to the square of the drive voltage, the drive force $f_D$ is given by:

$$f_D = K_D[A^2 + B^2 + 2 ABsq(\omega t)]$$

Where $K_D$ is the forcing constant associated with the drive electrodes.

As can be seen, the drive force has substantial energy at frequency $\omega$, needed to drive the proof-masses.

In the past, on-frequency drive (i.e., drive signals having the same frequency as the drive-axis oscillation and signal containing Coriolis information) has been used along with a sense-axis carrier in an attempt to circumvent the effects of fundamental drive feedthrough. However, the problems associated with carrier electrical feed-though as well as possible excitation of sense-axis mechanical modes by carrier-induced and carrier generator noise-induced forces makes this approach problematic.

The preferred system also utilizes charge amplifiers that employ a DC stabilization approach based upon an active resistor. Normally, to stabilize the operating point of a charge amplifier, a very large resistor (hundreds of MEG ohms to Giga Ohms) must be used in the amplifier feedback path. Such resistors are prohibitively large in physical size to efficiently implement on an ASIC. This implementation uses an active resistor made using a specially biased transistor.

The output of the rate charge amplifier 201, after some gain, is digitized using a band-pass sigma-delta modulator 216. This approach enables an area-efficient high dynamic-range digitization of the signal containing the Coriolis information. Once digitized, the signal is digitally-filtered by the controller 220, implemented in an FPGA, for example, and demodulated (both in-phase and quadrature). The quadrature information is used for quadrature nulling (discussed earlier) and the rate information comprises the rate sensor output. In plane proof-mass oscillation amplitude is controlled using an analog control loop, with continuous-time loop controller.

In addition, a phase-locked loop (PLL) 200 is preferably used to remove drive feedthrough artifacts from the proof-mass in-plane pickoff signal. This allows generation of a spectrally-pure reference signal for the drive signal and all demodulation processes. The PLL 200 generates a lock-detect signal once it is in a locked state, which is used to control various functions in the electronics in order to optimize performance in the steady-state. The PLL being in the locked state is used to transition from start to run and thus the state of the S/R bit. The S/R bit, for "Start/Run", is the lock-detect signal. When S/R is asserted, the system is said to be in Start Mode. When de-asserted, the system is said to be in RUN Mode (normal steady-state operation).

The following is the description of a mixed-signal controller 220 implemented possibly in an application-specific integrated circuit (ASIC) intended to control and read-out a MEMS tuning fork gyroscope. The ASIC further preferably employs a field-programmable gate array (FPGA) to implement the gate-intensive digital functionality. Nevertheless, the use of the FPGA is not critical. Other options are a digital ASIC or to include the digital functionality onto the mixed-signal ASIC.

The controller 220 preferably includes all motor loop functions (including motor charge amplifier, motor post amplifier, position comparator, analog ninety degree phase shifter, velocity comparator, motor drive circuitry, phase-locked loop (PLL), and high-voltage motor drivers), all rate channel front-end functions (including rate charge amplifier, rate post-amplifier, rate sigma-delta modulator, and high-voltage sense bias generator), compensation variable converter, quadrature 1-bit DAC, and high-voltage supplies.

In addition, a digital signal processor (DSP) is employed. In general, the DSP can be implemented as a separate chip or can be implemented in the FPGA or in a mixed signal ASIC.

The DSP performs the functions of I/Q sinusoidal demodulation, filtering, quadrature loop filter, compensation variable converter control, and serial interface. The architecture has been defined such that the analog ASIC can operate independently of the DSP, but not function fully to support a high-performance gyro.

Figure 3:
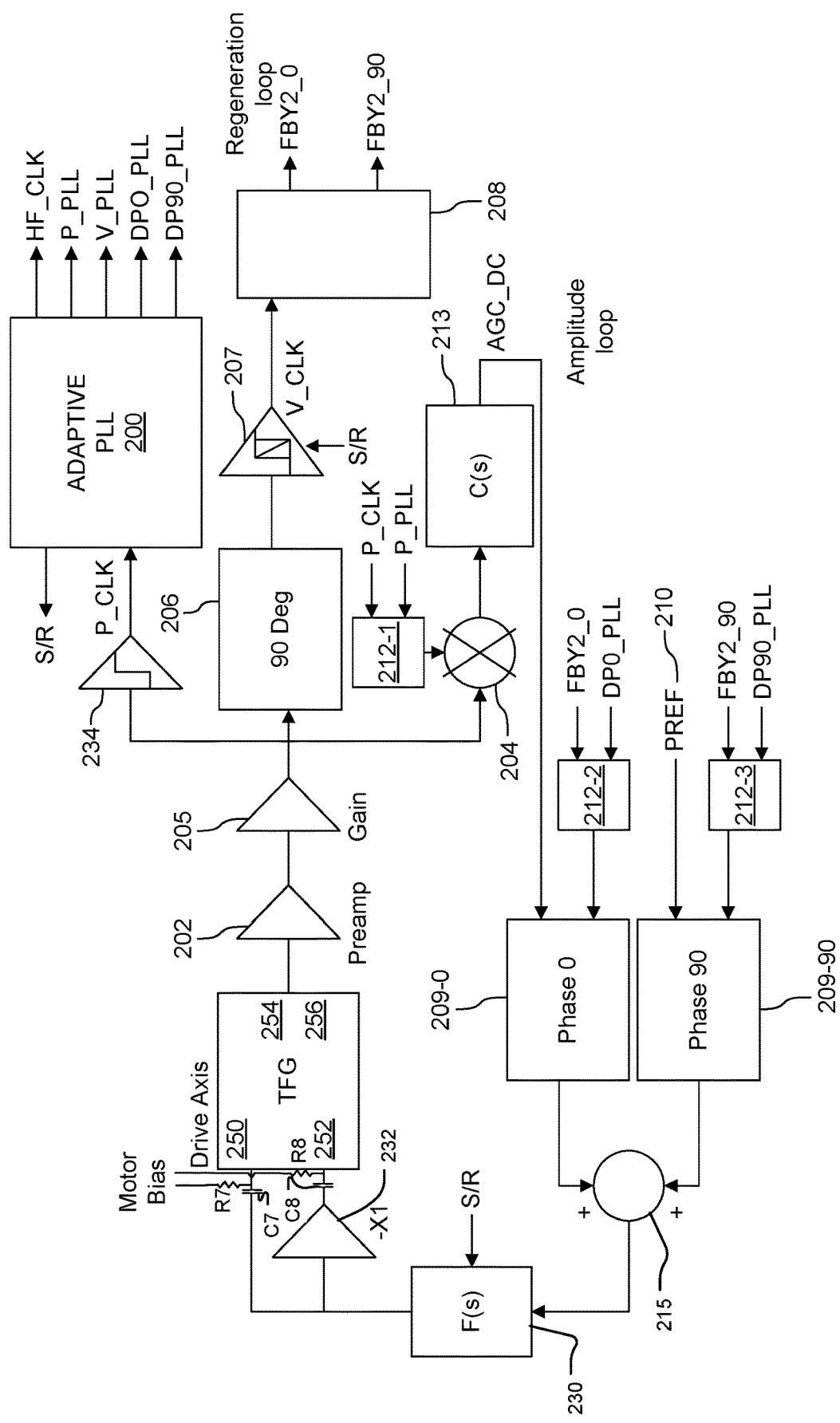
FIG. 3 is a block diagram of a motor section for operating the tuning fork gyroscope.
Figure 4:
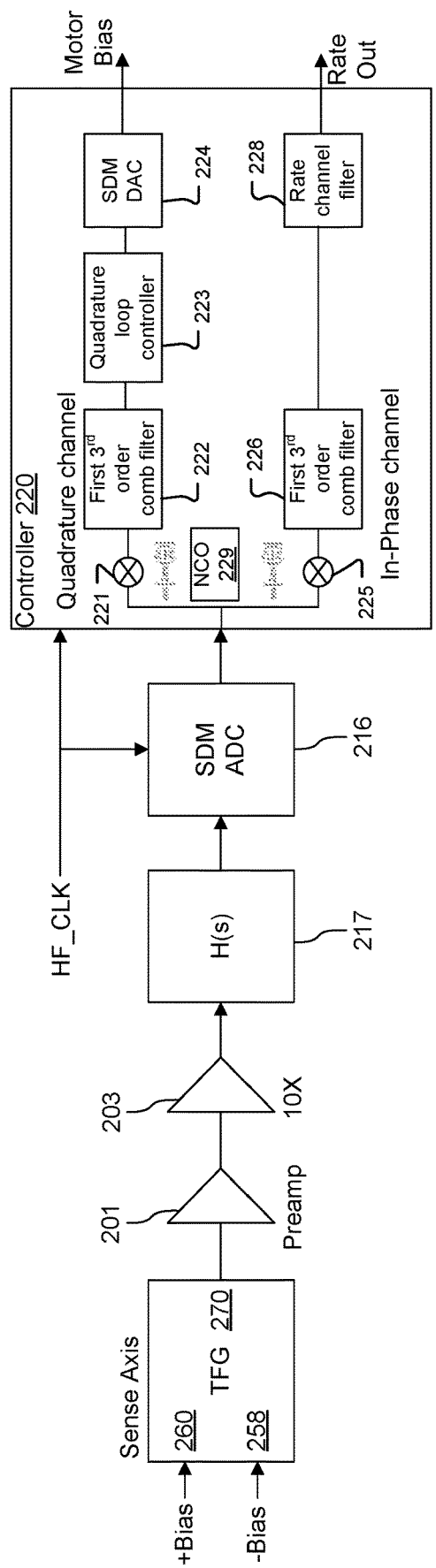
FIG. 4 is a block diagram of a rate section for operating the tuning fork gyroscope.

The controller can be divided into a motor section shown in FIG. 3 and a rate section shown in FIG. 4.

FIG. 3 shows the motor section. It includes a major loop for amplitude control (AGC loop) and a minor loop for regeneration. The architecture includes a START mode and a RUN mode. The RUN mode uses clocks derived from the PLL to control the gyro.

The regeneration loop has a motor charge amplifier 202 to measure in-plane proof-mass position. Specifically, the charge amplifier 202 is connected to the pick off combs 121L and 121R via the left inner comb pickoff electrode 254 and the right inner pick off comb electrode 256 provides an electrical connection to the right inner comb drive. A gain amplifier section 205 amplifies the output from the charge amplifier 202. Then, an analog ninety-degree phase shifter 206 shifts the phase of the output of the gain amplifier 205 to compensate for phase shift through the motor.

A precision comparator 207 squares-up the output of the 90-degree phase shifter 206 to produce a velocity clock V_CLK. The velocity clock V_CLK is used to generate the drive clocks: FBY2_0 and FBY2_90. Specifically, frequency separation logic 208 takes the V_CLK as an input. The V_CLK represents a logic wave that is synchronous to motor velocity. Logic 208 outputs: FBY2_0, which is a logic wave synchronous to motor velocity but at half its frequency, and FBY2_90, which is a logic wave leading FBY2_0 by 90 degrees.

These drive clocks FBY2_0 and FBY2_90 are used to produce the two half-frequency drive phases. Signals FBY2_0 and FBY2_90 are provided to differential motor drivers 209-0, 209-90, which generate the drive voltages to the electrodes 250, 252. The driver signals are summed using motor drive summer 215 to produce the drive signal. The drive signal is passed through a rounding filter 230 to produce drive signals applied to electrodes 250, 252. The rounding function is employed only in RUN mode, i.e., when S/R is de-asserted, in order to reduce drive distortion due to possible slew-rate limiting in the drive amplifiers. (It is assumed that split drive electrodes are utilized.) An inverting amplifier 232 flips the phase of the signal to be applied to the electrode 252 of the right comb drive 120. In both cases, capacitors C7 and C8 located on the connection to the electrodes 250, 252 to allow a DC bias to also be placed on the comb drives 118, 120. The DC bias is used for quadrature nulling, as discussed earlier.

The output from the gain amplifier 205 is also received by comparator 234. This is used to square-up the position signal, which is nominally a sine-wave in phase with motor position. The comparator 234 produces signal P_CLK. When position signal is positive, P_CLK is logic HI; when position signal is negative, P_CLK is logic LO.

The output from the gain amplifier 205 is further multiplied by either the P_CLK signal or the P_PLL signal from the adaptive PLL 200 in a multiplier 204 that functions as an amplitude demodulator. This is a switching type of demodulator. The switching is controlled by P_CLK in the START mode, and by P_PLL in RUN mode. AGC controller 213 acts on the difference between the detected amplitude and a reference voltage. The AGC controller output is used to determine the amplitude of the phase 0 drive component. The phase 90 drive component is fixed in amplitude. The two drive components are summed in summer 215 and the sum is passed through rounding filter 230 and then amplified to produce drive signals 250 and 252.

Multiplexers 212-2 and 212-3 are digital multiplexers that select FBY2_0 and FBY2_90 in START modes, and DP0_PLL and DP90_PLL in RUN mode. The reason for doing this is that the PLL-generated clocks have less phase jitter and provide higher performance.

Note that the PLL 200 must generate the high-frequency clock HF-CLK for the rate sigma-delta modulator (SDM 216, see below). Additionally, also generated are P_PLL, which is the position clock in RUN mode, V_PLL, which is the velocity clock in RUN mode.

FIG. 4 shows the rate section. It includes the charge amplifier 201 to measure the signal charge on the proof-masses 112, 114 and is thus connected to electrode 270. The voltage signal from the charge amplifier 201 is amplified by a Rate Post Amplifier 203, which adds gain. A rate analog anti-aliasing filter 217 conditions the signal. Finally, the conditioned voltage is presented to the rate sigma delta modulator (SDM) 216 that functions as the front end of an analog to digital converter (ADC). The rate SDM 216 produces a pulse-density signal whose pseudo-average corresponds to the charge amplifier output. The rate SDM output is presented to the controller 220.

In the controller 220, digital filtering is performed as part of the ADC function. Specifically, a digital numerically controlled oscillator NCO 229 is used to generate I/Q digital sinusoids:

$$\cos\left[2\pi n\left(\frac{fo}{fs}\right)\right] \text{ and } \sin\left[2\pi n\left(\frac{fo}{fs}\right)\right].$$

These two I/Q digital sinusoids are multiplied with the rate SDM output signal in two multipliers 221, 225, producing demodulated digital I/Q signals. The demodulated I/Q signals are respectively filtered by a first $3^{rd}$-order digital comb filter 222 and second $3^{rd}$-order digital comb filter 226. For the Q channel, the comb filter output is passed to a digital controller that functions a quadrature loop controller 223, the output of which is presented to a sigma-delta digital to analog converter (DAC) 224 to produce the motor bias for quadrature nulling.

The motor bias (Motor Bias) is applied through two resistors R7, R8 to electrodes 250, 252 to DC bias the comb drives 118, 120. The quadrature controller output is supplied to the resistors shown, which places a DC signal on the drive electrodes to null quadrature charge.

For the I channel, multiplier demodulator 225 recovers the AM or r(t). The comb filter output is presented to a multi-tap finite impulse response (FIR) rate channel filter 228, which determines sensor bandwidth and suppresses the dominant rotational mode. Final rate output word (Rate Out) length is 24 bits, in one specific implementation.

There is also an ADC to measure temperature and AGC voltages (so-called compensation variables). The instrument serial output includes the rate and compensation variable words in each frame.

Charge Amplifier Design

The charge sensitive amplifiers 201, 202 rely on capacitive feedback to convert charge stored in a capacitor to an output voltage proportional to the input charge. The signal transfer function through a charge amplifier does not include DC so a resistive feedback element is required to stabilize the DC bias and establish an output common mode voltage level. The resistor needs to be large enough such that its noise contribution is negligible within the band of interest. For inertial instruments, bio-potentials and other low frequency signals, this can result in a resistor in the hundreds of mega-ohms to giga-ohms. High value resistors can be difficult to implement on chip due to the area required to realize the resistor. Furthermore, any practical device of this size would have a large amount of distributed capacitance that would reduce the effectiveness of such a resistor.

Figure 5:
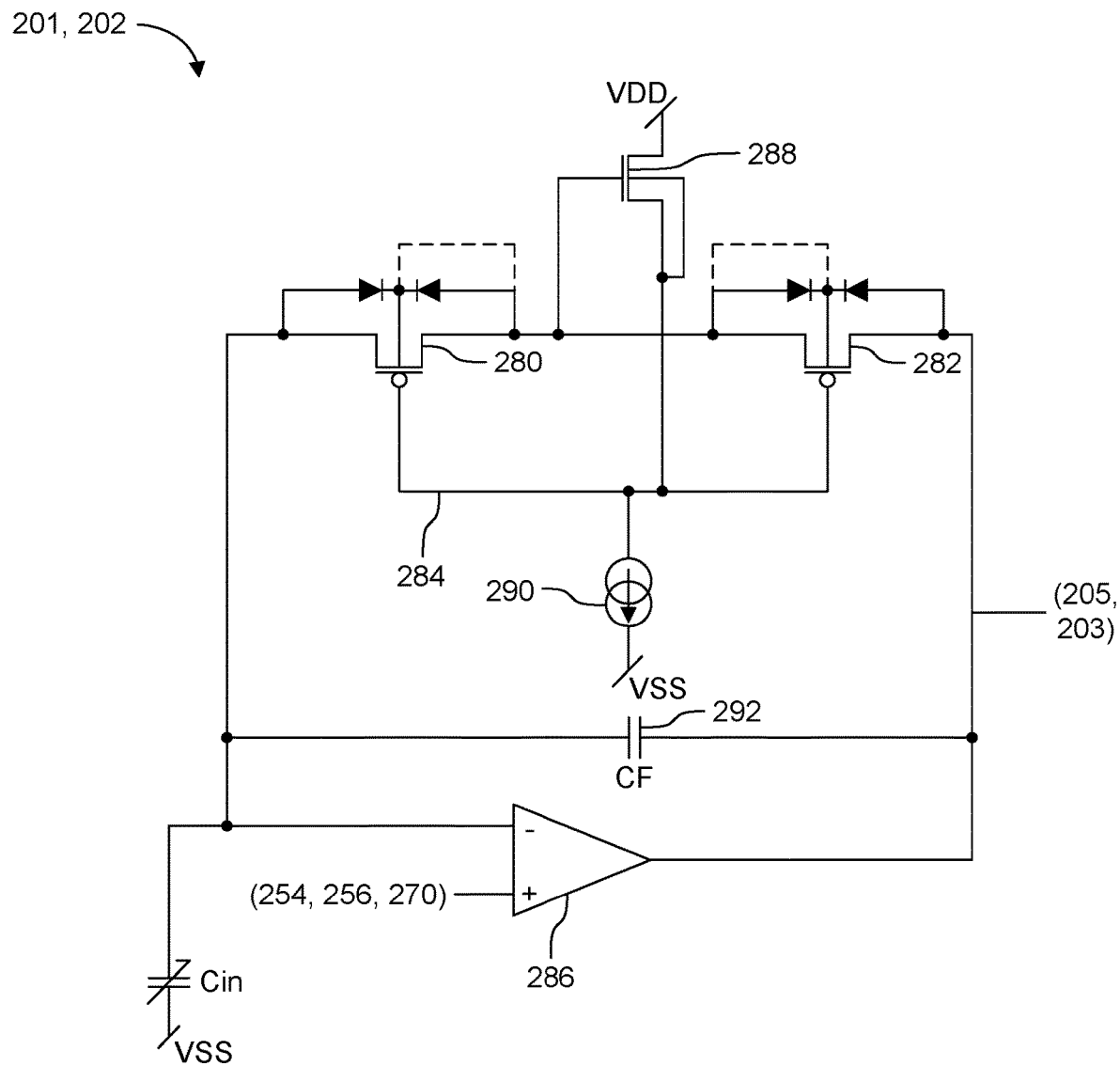
FIG. 5 is a circuit diagram showing an implementation for the charge amplifiers 201, 202.

FIG. 5 is a circuit diagram showing the design of the charge amplifiers 201, 202.

The charge amplifier generally includes an operational transconductance amplifier 286 that receives the input from the TFG at its inverting input (−). A feedback capacitor CF connects the output of the op-amp 286 to its inverting input (−).

Saturation and buildup of charge on the feedback capacitor CF is prevented by a resistive bleedoff circuit connected in parallel with the feedback capacitor. It is made from three CMOS transistors 280, 282, 288 and a current sink 290. The resistive element is implemented with two PMOS transistors 280, 282 connected in series with their sources connected as a common node 284. The bulk terminal of each PMOS 280, 282 is connected to the common source node which effectively short circuits the source to bulk parasitic diode.

The drains of the PMOS transistors 280, 282 are connected to the inverting terminal and output of the operational transconductance amplifier 286, respectively. The gates of the PMOS transistors 280, 282 are connected together at the source of an NMOS 288 and current sink 290. The purpose of the current sink is to set a specific bias point to push the PMOS transistors into subthreshold. It also allows the impedance to be modulated to improve the initial start-up transient.

The drain of the NMOS transistor 280 is connected to a fixed supply voltage VSS. The capacitance of the sensor is designated as Cin. The gate of the NMOS transistor 280 is connected to the common source node of the PMOS transistors.

The current flowing in the NMOS transistor 288 creates a constant gate-source voltage drop across the NMOS transistor. The source of the NMOS 288 transistor pushes the gate of the PMOS transistors 280, 282 to a lower potential than their source which biases them on allowing current to flow through the transistors. Specifically, the PMOS transistors 280, 282 are biased in saturation but at sub-threshold. This results in a very small amount of current for a given gate-source bias. Because the transistors are in saturation, there is a very small change in drain source current in response to a change in drain source voltage. The NMOS transistor 288 "tracks" the common mode voltage and applies a constant bias to the PMOS transistors 280, 282 as the common mode voltage changes, maintaining the sub-threshold bias point. The effective resistance of the device can be changed by modulating the bias current of the NMOS transistor 288.

The PMOS devices 280, 282 must be sized with an aspect ratio<<1 to increase the gate source bias necessary to push them out of sub-threshold. The NMOS device 288 must be sized with a large aspect ratio to ensure that its gate source voltage is small for a given bias current. The bias current needs to be on the order of hundreds of nano-amps to keep the NMOS transistor 288 in subthreshold and to keep the NMOS small enough such that it does not add excessive parasitic capacitance to the device. A substrate isolated NMOS (Triple well) must be used in order to negate the increase in threshold voltage associated with the body effect.

The arrangement of the PMOS transistors ensures that regardless of current flow direction, the drain-bulk diodes are never simultaneously forward biased and thus do not contribute impedance of the "pseudo-resistor". If the diodes were allowed to become forward biased when processing large signals, the impedance would be modulated and linearity would suffer. With the back-to-back, source connected PMOS transistors, the impedance is dominated by the channel resistance of the PMOS transistors (biased in sub-threshold).

In addition, the power consumption of this circuit is small because it is biased in subthreshold and there is no additional amplifier in the feedback loop. The combination of small size and low power consumption make it useful in a variety of systems that require low power and a large number of amplification channels (i.e. Neural potential front ends).

Figure 6:
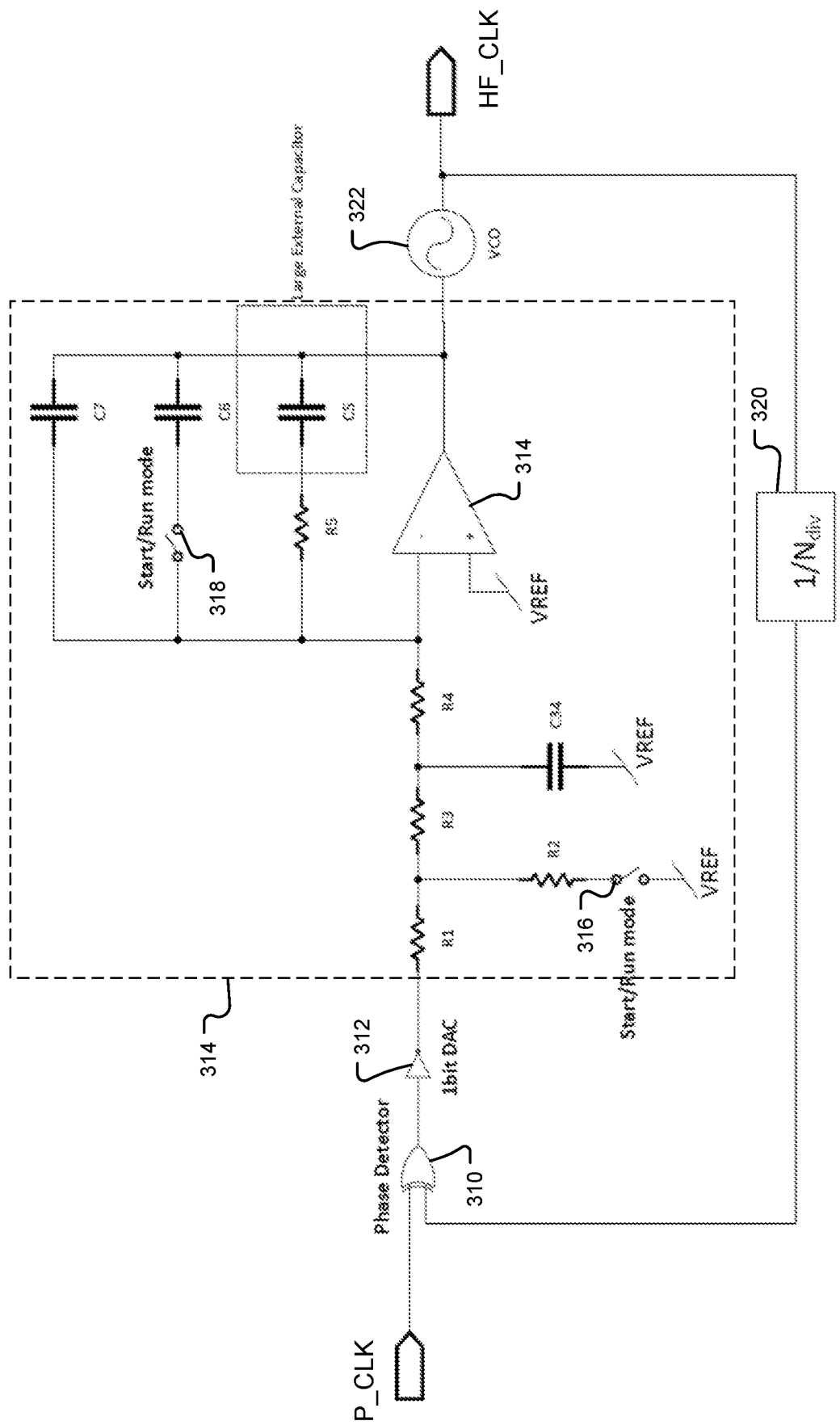
FIG. 6 is circuit diagram showing an implementation for the phase locked loop 200.

FIG. 6 is a circuit diagram of the phase locked loop 200. It receives position signal P_CLK from the comparator 234. P_CLK is provided to a phase detector 310. The PLL produces HF_CLK, which is a high-frequency clock that is synchronous to the gyro motor frequency. It is used for the SDM over-sampling clock and also serves as a high-frequency synchronous clock for controller 220.

The output of the phase detector is provided to a 1 bit digital to analog converter 312 to stabilize the output of the phase detector.

The PLL's loop filter 314 has two modes of operation. In a START mode, its bandwidth is wide to improve lock performance. In RUN mode, the loop bandwidth is tightened to reject half frequency drive artifacts. Additionally, in RUN mode, the loop gain is very high at low frequencies to allow close tracking of low frequency input phase. This helps to reject low-frequency noise contributed by the VCO.

In more detail, according to one possible example of the loop filter 314, three resistors R1, R3, R4 connect the output of the 1 bit digital to analog converter 312 to the inverting input of a loop filter comparator 316. The non-inverting input to the loop filter comparator 316 is connected to ground or VREF.

The junction between resistors R1 and R3 is connected to ground through resistor R2 when a switch 316 is open during RUN mode. Switch 316 is closed during start mode when S/R is asserted.

The junction between resistors R3 and R4 is connected to ground through capacitor C34.

Feedback from the output of comparator 314 to its inverting input is provided by capacitor C7. Additional feedback is provided by resistor R5 and large capacitor C5 in series.

Finally, capacitor C6 is also connected in feedback by switch 318 when a switch 318 is closed. Switch 318 is closed during START mode, and open during RUN mode.

Finally, voltage controlled oscillator (VCO) 322 is controlled by the output of op-amp 314 and generates the VCO output, called HF_CLK. S/R as a standard lock detect function. It is asserted until the PLL locks.

Feedback to the phase detector 310 is provided through $1/N_{div}$ 320. This is a frequency divider, which reduces the high-frequency VCO output to a much lower frequency where it can be compared to the P_CLK reference. The frequency divider also produces the other low-frequency clocks, which have the PLL suffix in their name.

While this invention has been particularly shown and described with references to preferred embodiments thereof, it will be understood by those skilled in the art that various changes in form and details may be made therein without departing from the scope of the invention encompassed by the appended claims.

What is claimed is:

1. A charge amplifier for a tuning-fork sensor, comprising:
   an amplifier;
   a feedback capacitor connecting an output of the amplifier to an input; and
   a bleedoff circuit for providing a feedback impedance for bleeding charge from the feedback capacitor, the bleedoff circuit comprising one or more transistors and a current sink, wherein the current sink is located between the gates of the series connected transistors and ground to provide a current to set a specific bias point to push the series connected transistors into subthreshold and the feedback impedance is changed by changing the current of the current sink.

2. The amplifier of claim 1, wherein the amplifier is a transconductance amplifier.

3. The amplifier of claim 1, wherein the bleedoff circuit comprises two transistors connected in series.

4. The amplifier of claim 3, wherein the two transistors are biased in subthreshold to implement a linear resistance.

5. The amplifier of claim 3, wherein gates of the two transistors are connected to each other to ensure that body diodes are not forward biased in the presence of signals which would degrade linearity.

6. The amplifier of claim 5, wherein a gate bias tracks changes in an input to maintain the same bias point for the two transistors in the presence of the signals.

7. The amplifier of claim 3, wherein gates of the series connected transistors are connected to a terminal of a third transistor.

8. The amplifier of claim 7, wherein the third transistor generates a gate bias for the two transistors due to a constant current flowing into the current sink.

9. The amplifier of claim 1, further comprising a capacitance of the sensor between the feedback capacitor and ground.

10. The amplifier of claim 1, wherein a feedback impedance is changed by changing the current of the current sink to improve start-up.

11. The amplifier of claim 2, wherein the transconductance amplifier receives an input from a tuning fork gyroscope (TFG) at its inverting input.

12. The amplifier of claim 1, wherein an output of the amplifier is digitized using a band-pass sigma-delta modulator.

* * * * *